United States Patent
Huang et al.

(10) Patent No.: US 9,625,497 B2
(45) Date of Patent: Apr. 18, 2017

(54) PREDICTING A NETWORK PERFORMANCE MEASUREMENT FROM HISTORIC AND RECENT DATA

(71) Applicant: Telefonaktiebolaget L M Ericsson (Publ), Stockholm (SE)

(72) Inventors: Kaiyuan Huang, Kanata (CA); Gary Tam, Hong Kong (HK)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 726 days.

(21) Appl. No.: 14/042,502

(22) Filed: Sep. 30, 2013

(65) Prior Publication Data

US 2014/0324371 A1 Oct. 30, 2014

Related U.S. Application Data

(60) Provisional application No. 61/816,337, filed on Apr. 26, 2013.

(51) Int. Cl.
*H04L 12/26* (2006.01)
*G01R 19/00* (2006.01)
(Continued)

(52) U.S. Cl.
CPC ....... *G01R 19/0092* (2013.01); *H04B 17/373* (2015.01); *H04L 41/147* (2013.01); *H04L 43/067* (2013.01); *H04B 17/26* (2015.01)

(58) Field of Classification Search
CPC . H04L 43/067; H04L 41/147; G01R 19/0092; H04B 17/373; H04B 17/26
(Continued)

(56) References Cited

U.S. PATENT DOCUMENTS

| 5,241,685 A | 8/1993 | Bodin et al. |
| 6,112,093 A | 8/2000 | Nordlund |

(Continued)

FOREIGN PATENT DOCUMENTS

| EP | 2475109 A1 | 7/2012 |
| EP | 2840815 A1 | 2/2015 |

(Continued)

OTHER PUBLICATIONS

"Evaluation of short-term traffic forecasting algorithms in wireless networks", 2006 2nd Conference on Next Generation Internet Design and Engineering, 2006. NGI '06.*

(Continued)

*Primary Examiner* — Bryan Bui
(74) *Attorney, Agent, or Firm* — Coats & Bennett, P.L.L.C.

(57) ABSTRACT

Prediction techniques are presented for predicting a current value of a performance measurement using historic performance measurement data and recent performance measurement data, which may not reflect the current conditions. A daily trend in a series of performance measurements is obtained. The daily trend comprises a set of data points at different times of day, wherein each data point represents an average value of the performance measurements at a corresponding time of day over a plurality of days. One or more recent performance measurements over a recent time interval are also obtained. A current value of the performance measurements is predicted, based on the daily trend and the recent performance measurements.

17 Claims, 12 Drawing Sheets

(51) Int. Cl.
*H04L 12/24* (2006.01)
*H04B 17/373* (2015.01)
*H04B 17/26* (2015.01)

(58) Field of Classification Search
USPC .................................. 702/189, 64; 370/230.1
See application file for complete search history.

(56) References Cited

U.S. PATENT DOCUMENTS

| | | |
|---|---|---|
| 6,381,458 B1 | 4/2002 | Frodigh et al. |
| 6,567,670 B1 | 5/2003 | Petersson |
| 6,985,739 B2 | 1/2006 | Spaling et al. |
| 7,668,946 B1 | 2/2010 | Garcia-Franco et al. |
| 8,014,776 B2 | 9/2011 | Nylander et al. |
| 8,374,090 B2 | 2/2013 | Morrill et al. |
| 8,626,213 B2 | 1/2014 | Frenger et al. |
| 2004/0152422 A1 | 8/2004 | Hoglund et al. |
| 2007/0192065 A1* | 8/2007 | Riggs .................... G06Q 10/04 |
| | | 702/189 |
| 2008/0049615 A1* | 2/2008 | Bugenhagen ....... H04L 43/0817 |
| | | 370/230.1 |
| 2010/0063715 A1 | 3/2010 | Wynter et al. |
| 2011/0170418 A1 | 7/2011 | Sagfors et al. |
| 2011/0310852 A1 | 12/2011 | Dimou et al. |
| 2012/0108245 A1 | 5/2012 | Zhang et al. |
| 2012/0140651 A1 | 6/2012 | Nicoara et al. |
| 2012/0297055 A9 | 11/2012 | Raleigh |
| 2012/0320888 A1 | 12/2012 | Annamalai et al. |
| 2013/0060964 A1 | 3/2013 | Shahar |
| 2013/0077482 A1 | 3/2013 | Krishna et al. |
| 2013/0077599 A1 | 3/2013 | Dimou et al. |
| 2013/0084864 A1 | 4/2013 | Agrawal et al. |
| 2013/0217435 A1 | 8/2013 | Tarraf et al. |
| 2014/0064158 A1 | 3/2014 | Timus |
| 2014/0086226 A1 | 3/2014 | Zhao et al. |
| 2014/0094142 A1 | 4/2014 | Torres et al. |
| 2014/0135018 A1 | 5/2014 | Hedberg et al. |
| 2014/0192727 A1 | 7/2014 | Liu et al. |
| 2014/0211626 A1 | 7/2014 | Liu |
| 2014/0323087 A1* | 10/2014 | Huang .................. H04W 48/16 |
| | | 455/411 |
| 2014/0349611 A1 | 11/2014 | Kant et al. |
| 2014/0349647 A1 | 11/2014 | Chen et al. |
| 2015/0163836 A1 | 6/2015 | Kobayashi et al. |

FOREIGN PATENT DOCUMENTS

| | | |
|---|---|---|
| JP | 2014212417 A | 11/2014 |
| WO | 2010124138 A1 | 10/2010 |
| WO | 2011028258 A2 | 3/2011 |
| WO | 2012022965 A2 | 2/2012 |
| WO | 2012149954 A1 | 11/2012 |
| WO | 2013050070 A1 | 4/2013 |
| WO | 2013155916 A1 | 10/2013 |

OTHER PUBLICATIONS

AT&T, et al., "WLAN-NS Key Issue #4—Solution", SA WG2 Meeting #96, Apr. 8, 2013, pp. 1-2, San Diego, California, USA, S2-131426.

Kyocera Corp., "Additional Use cases involving WLAN", 3GPP TSG RAN WG3 Meeting # 84, Seoul, REpublic of Korea, May 19, 2014, pp. 1-4, R3-141293, 3GPP.

Intel Corporation, "Performance benefits of RAN level enhancements for WLAN/3GPP", 3GPP TSG-RAN WG2 Meeting #83bis, Ljubljana, Slovenia, Oct. 7, 2013, pp. 1-10, R2-133604, 3GPP.

Papadopouli, M., et al., "Evaluation of short-term traffic forecasting algorithms in wireless networks", 2nd Conference on Next Generation Internet Design and Engineering, NGI '06, Apr. 3, 2006, pp. 102-109, Valencia, Spain, XP010935442.

Papadopouli, M., et al., "Short-Term Traffic Forecasting in a Campus-Wide Wireless Network", 2005 IEEE 16th International Symposium on Personal, Indoor and Mobile Radio Communications, Sep. 11, 2005, pp. 1446-1452, Piscataway, New Jersey, XP032391733.

Ericsson, et al., "WLAN/3GPP Radio Interworking—More on Idle and Connected mode", 3GPP TSG-RAN WG2 #82, Fukuoka, Japan, May 20, 2013, pp. 1-10, Tdoc R2-131886, 3GPP.

* cited by examiner

PREDICTING A NETWORK PERFORMANCE MEASUREMENT FROM HISTORIC AND RECENT DATA

RELATED APPLICATION

This application claims priority to U.S. Provisional patent Application Ser. No. 61/816,337 filed Apr. 26, 2013, the entire contents of which are incorporated herein by reference.

TECHNICAL FIELD

The disclosure relates generally to wireless communications and, more particularly, to the prediction of a network performance measurement where current performance measurements are not available.

BACKGROUND

Many types of performance measurements, such as average throughput, are used in the management and control of a wireless communication network. In many scenarios, a current performance measurement may not be immediately available due to delays in data collection, data processing, and data transport. When current performance measurements are not available, control decisions are typically based on the most recent available performance data, which may no longer reflect the current network conditions. Using performance data that lags the current time for network control functions can degrade network performance.

SUMMARY

This disclosure describes techniques for predicting a current value of a performance measurement using historic performance measurement data and recent performance measurement data, which may not reflect the current network conditions.

Exemplary embodiments of the disclosure comprise methods implemented by a network node in a communication network of predicting a current value of a performance measurement indicative of network performance. In one exemplary method, the network node obtains a daily trend in a series of performance measurements. The daily trend comprises a set of data points at different times of day, wherein each data point comprises an average value of the performance measurements at a corresponding time of day over a plurality of days. The network node further obtains one or more recent performance measurements over a recent time interval, which may no longer reflect current network conditions. For example, the recent performance measurements may comprise the performance measurements made over the most recent fifteen minute interval. The network node predicts, based on the daily trend and the recent performance measurements, the current value of the performance measurement.

In some embodiments, predicting the current value of the performance measurement comprises computing a first average value of the recent performance measurements over the recent time interval, computing a second average value of the daily trend over the recent time interval, and computing the current value of the performance measurement as a function of the first and second average values.

In some embodiments, predicting the current value of the performance measurement as a function of the first and second average values comprises computing a difference between the second average value of the daily trend and a current value of the daily trend, and adding the difference to the first average value to obtain the current value of the performance measurement.

In some embodiments, obtaining a daily trend in a series of performance measurements comprises maintaining a record of historic performance measurements, and computing the daily trend from a record of historic performance measurements.

In some embodiments, the daily trend comprises a weekday trend based on performance measurements over a plurality of weekdays.

In some embodiments, the daily trend comprises a calendar day trend based on performance measurements taken on the same calendar day over a plurality of weeks.

In some embodiments, the performance measurement comprises an average throughput.

In some embodiments, the method further comprises controlling a network function based on the current performance measurement.

In some embodiments, controlling a network function based on the current performance measurement comprises controlling admission to the network based on the current performance measurement.

In some embodiments, controlling admission to the network based on the current performance measurement comprises determining an admission threshold based on the current performance measurement, and admitting users to the network based on the admission threshold.

Other embodiments of the disclosure comprise a network node in a wireless communication network for predicting a current value of a performance measurement indicative of network performance. One exemplary network node comprises a network interface circuit for communicating with other network nodes and a processing circuit configured to predict a current value of a performance measurement. More particularly, the processing circuit is configured to obtain a daily trend in a series of performance measurements. The daily trend comprises a set of data points at different times of day, wherein each data point comprises an average value of the performance measurements at a corresponding time of day over a plurality of days. The processing circuit is configured to obtain one or more recent performance measurements over a recent time interval, which may no longer reflect current network conditions. For example, the recent performance measurements may comprise the performance measurements made over the most recent fifteen minute interval. The processing circuit is configured to predict, based on the daily trend and the recent performance measurements, the current value of the performance measurement.

In some embodiments, the processing circuit is configured to predict the current value of the performance measurement by computing a first average value of the recent performance measurements over the recent time interval, computing a second average value of the daily trend over the recent time interval, and computing the current value of the performance measurement as a function of the first and second average values.

In some embodiments, the processing circuit is configured to predict the current value of the performance measurement as a function of the first and second average values by computing a difference between the second average value and a current value of the daily trend, and adding the difference to the first average value to obtain the current value of the performance measurement.

In some embodiments, the processing circuit is configured to obtain a daily trend in a series of performance measurements by maintaining a record of historic performance measurements, and computing the daily trend from a record of historic performance measurements.

In some embodiments, the daily trend comprises a weekday trend based on performance measurements over a plurality of weekdays.

In some embodiments, the daily trend comprises a calendar day trend based on performance measurements taken on the same calendar day over a plurality of weeks.

In some embodiments, the performance measurement comprises an average throughput.

In some embodiments, the processing circuit is further configured to control a network function based on the current performance measurement.

In some embodiments, the processing circuit is configured to control a network function based on the current performance measurement by controlling admission to the network based on the current performance measurement.

In some embodiments, the processing circuit is configured to controlling admission to the network based on the current performance measurement comprises determining an admission threshold based on the current performance measurement, and admitting users to the network based on the admission threshold.

DETAILED DESCRIPTION

The present disclosure describes techniques for predicting a current value of a performance measurement used to control or manage a wireless communication network. The predication techniques described herein are applicable in any situation where a current performance measurement is not available. As an aid in understanding the disclosure, exemplary embodiments of the prediction technique will be described in the context of access selection between two access networks. In the access selection example described below, the prediction techniques are used to predict the average throughput per user for a group of cells in a first access network. The predicted average throughput is then used to control user selection by a user terminal between cells in the first access network and cells in a second access network.

Figure 1:
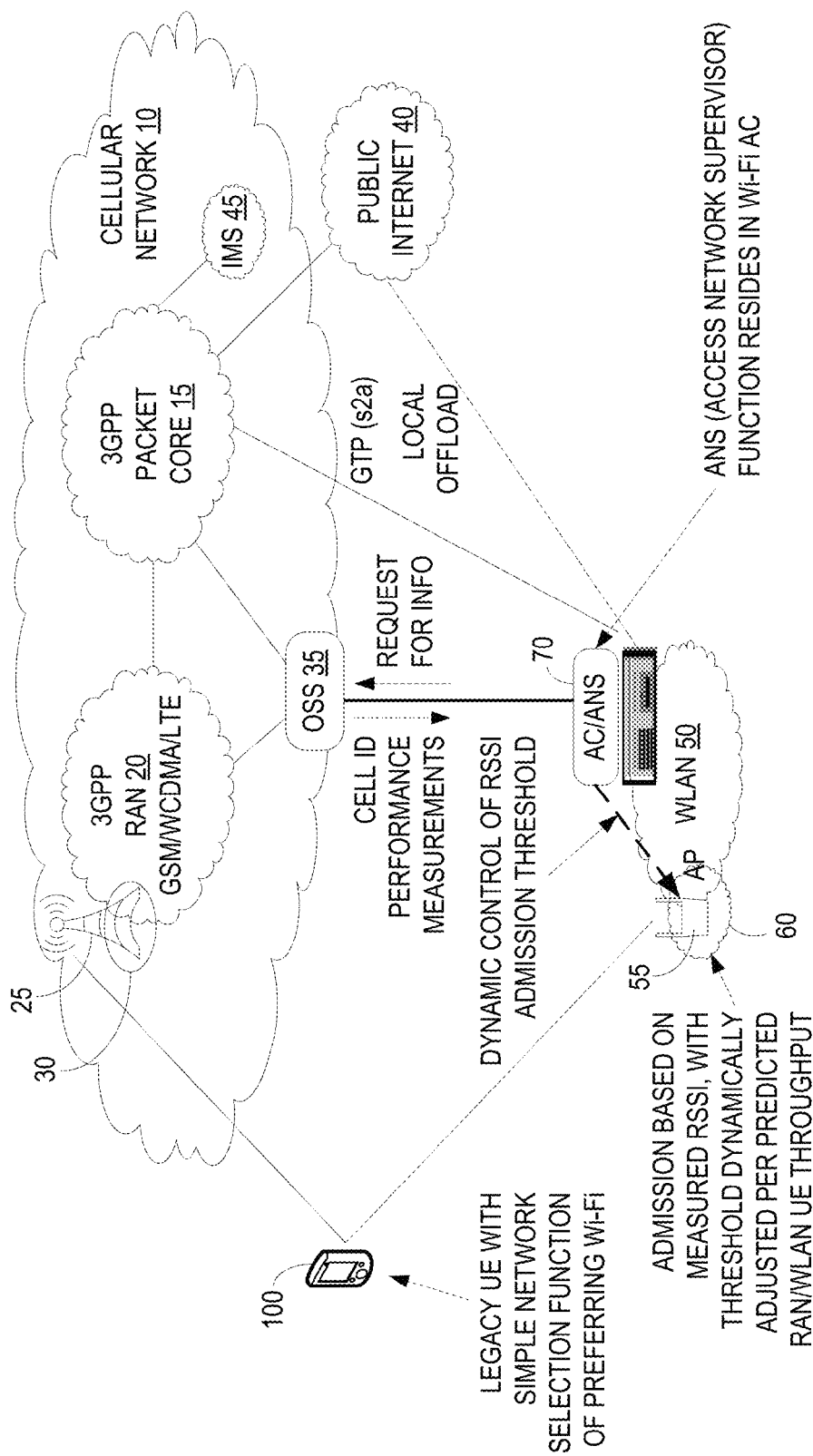
FIG. 1 illustrates a communication network implementing an access selection approach as described herein.

FIG. 1 illustrates an exemplary communication environment comprising first and second access networks in which the access selection techniques may be employed. The first access network comprises a cellular network 10, such as a Global System for Mobile Communication (GSM) network, Wideband Code Division Multiple Access (WCDMA) network, Long Term Evolution (LTE) network, or other cellular network. The cellular network 10 includes a packet core network 15 and radio access network (RAN) 20. The RAN 20 includes one or more base stations (BSs) 25 that provide coverage in respective cells 30 of the cellular network 10. A single base station 25 may serve multiple cellular network cells 30. The packet core network 15 provides connection to external networks, such as the Internet 40 and IP Multimedia Subsystem (IMS) networks 45. The second access network comprises a Wireless Local Area Network (WLAN) 50 operating according to the IEEE 802.11 family of standards. The WLAN 50 includes one or more access points (APs) 55 that provide coverage in respective Wi-Fi cells 60. A single AP 55 may serve multiple Wi-Fi cells 60.

A dual mode user terminal 100 is also shown that is capable of communicating with both the base stations 25 in the cellular network 10 and the APs 55 in the WLAN 50. The user terminal 100 is identified in the cellular network 10 by an International Subscriber Identity (IMSI). The user terminal 100 is identified in the WLAN 50 by a Medium Access Control (MAC) address.

The WLAN 50 includes an Access Control (AC) node 70 with an Access Network Supervisor (ANS) function that controls admission to the WLAN 50. The AC node 70 communicates with an Operation and Support System (OSS) 35 in the cellular network 10 as will be hereinafter described in more detail. Although shown separately, the OSS 35 may be located in the core network 15 of the cellular network 10. In one exemplary embodiment, the AC node 70 sends requests for information to the OSS 35. For example, the AC node 70 may request a cell ID or performance measurements for a cellular network cell 30 or a group of cells. In response to the request for information, the OSS 35 may send the requested information to the AC node 70.

Figure 2:
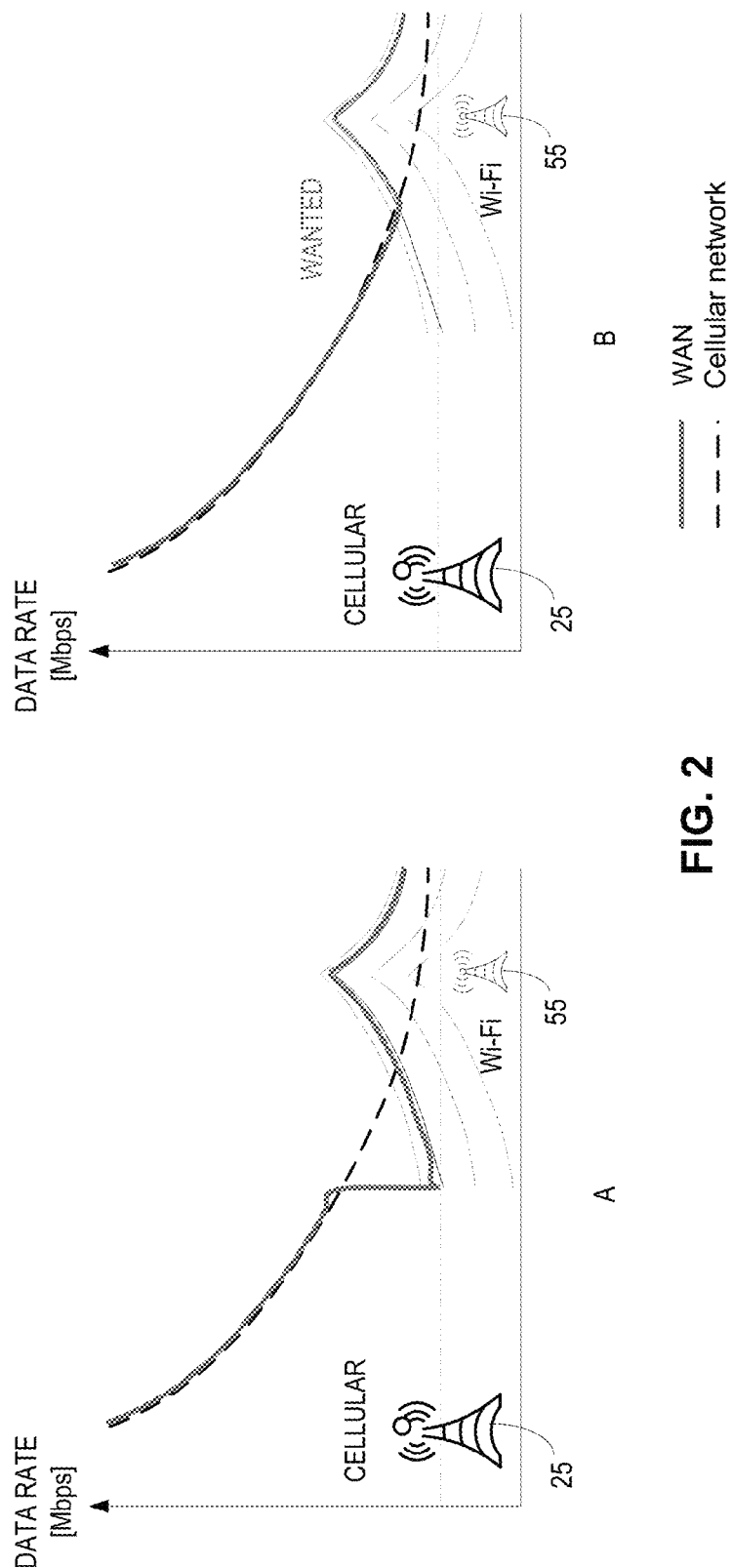
FIGS. 2A and 2B illustrate switching by a user terminal between a cellular network cell and Wi-Fi cell.

FIG. 2A illustrates the current access selection approach in use today where a user terminal 100 favors a WLAN connection over a cellular network connection. A user terminal 100 having a cellular network connection will switch to a Wi-Fi cell 60 as soon as it is able to connect to the Wi-Fi 60 cell even though the cellular network 10 provides higher throughput than the WLAN 50. There is no coordination between the cellular network 10 and the WLAN 50. The immediate switching to the Wi-Fi cell 60 by the user terminal 100 as soon as it is able to establish a connection with the Wi-Fi cell 60 results in a significant drop in data throughput for the user terminal 100. This approach becomes more problematic with the increasing number of Wi-Fi cells 60.

FIG. 2B illustrates an alternative approach according to one embodiment of the disclosure. As shown in FIG. 2B, the user terminal 100 does not immediately switch to the Wi-Fi cell 60 as soon as it is able to establish a connection to the Wi-Fi cell 60. Rather, switching from the cellular network 10 to the Wi-Fi cell 60 is based on expected performance of the Wi-Fi Cell 60 relative to the cellular network cell 30. In one embodiment, switching from the cellular network 10 to the Wi-Fi cell 60 is delayed until the data throughput for the Wi-Fi cell 60 is roughly equal to the data throughput for cellular network 10. This approach provides a better experience for the user.

The access selection in one embodiment has two major components. First, the cellular network cells 30 providing overlapping coverage with a Wi-Fi cell 60 are identified and correlated with the Wi-Fi cell 60. Second, adaptive selection control is provided by adjusting a Received Signal Strength Indicator (RSSI) threshold used for admitting user terminals 100 to the Wi-Fi cell 60. The threshold is referred to herein as the RSSI-Admit threshold or admission threshold.

The cellular network cells 30 may, for example, comprise GSM cells, WCDMA cells, LTE cells, or a combination thereof. In one embodiment, up to nine cellular network cells 30 can be correlated with a single Wi-Fi cell 60. Any additional cellular network cells 30 of lesser significance are ignored. The correlation of cellular network cells 30 to Wi-Fi cells 60 is performed automatically on an ongoing basis so that changes in network configuration are detected and accounted for. Changes in network configuration may, for example, be due to cell splitting, addition of cells, deletion of cells, etc.

The RSSI-Admit threshold is used to control the effective coverage area or effective size of a Wi-Fi cell 60. A user terminal 100 is admitted when the RSSI-Admit threshold is met and is not admitted otherwise. Lowering the RSSI-Admit threshold increases the effective coverage area of the Wi-Fi cell 60. Raising the RSSI-Admit threshold decreases the effective coverage area of the Wi-Fi cell 60.

The adjustment of the RSSI-Admit threshold may be performed for all Wi-Fi cells 60 in the WLAN 50 by a centralized access control (AC) node 70 in the WLAN 50. Alternatively, each AP 55 in the WLAN 50 network may separately determine the RSSI-Admit threshold for Wi-Fi cells 60 served by the AP 55.

Predicted average throughput for the Wi-Fi cell 60 is used to set the RSSI-Admit threshold and thus control the effective cell size. In one exemplary embodiment, the RSSI-Admit threshold is set so that the predicted average throughput for the Wi-Fi cell 60 is roughly equal to the cellular network cell 30. In some embodiments, a carrier configurable bias may be used to allow a carrier to favor either the cellular network 10 connection or the WLAN 50. The bias can be dynamically adjusted depending on current conditions. For example, when the cellular network 10 is congested, the carrier may favor the WLAN 50 over the cellular network 10 to reduce the load on the cellular network 10. When the load in the cellular network 10 is light, the carrier may want to favor the cellular network 10.

Figure 3:
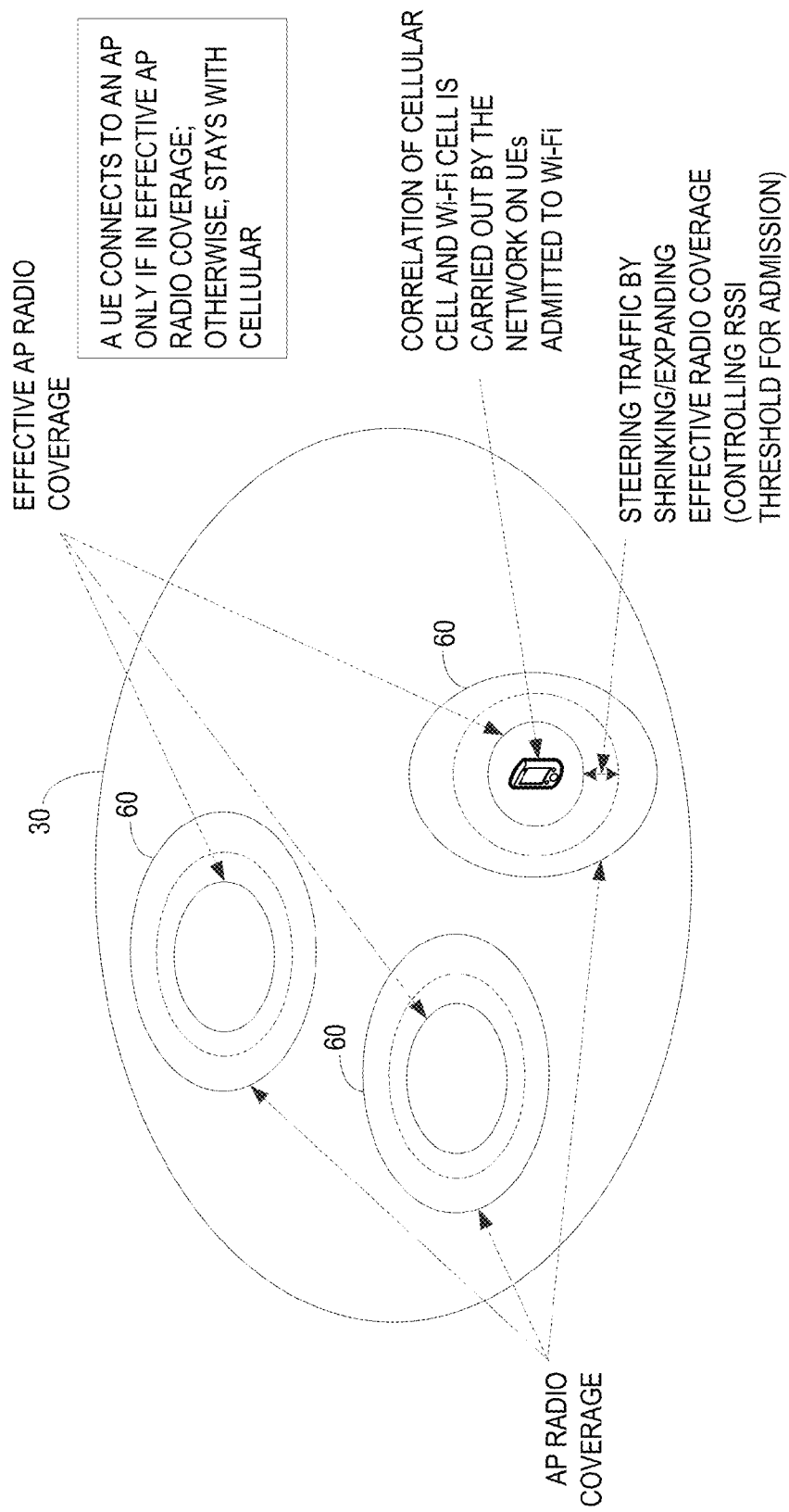
FIG. 3 illustrates control of access selection by a user terminal based on use of an admission threshold to control an effective size of a Wi-Fi cell.

FIG. 3 illustrates how the RSSI-Admit threshold is used for controlling access selection by a user terminal between a first access network and a second access network. FIG. 3 shows the actual radio coverage area (RCA) of three Wi-Fi cells 60 within the coverage area of a cellular network cell 30. Each Wi-Fi cell 60 also has an effective coverage area (ECA) that is determined by the RSSI-Admit threshold. A user terminal 100 is admitted to the Wi-Fi cell 60 only if the user terminal 100 is within the effective coverage area as determined by the RSSI-Admit threshold. As shown in FIG. 3, the RSSI-Admit threshold can be adjusted dynamically to vary the effective coverage area of the Wi-Fi cell 60. The effective coverage area may be increased by lowering the RSSI-Admit threshold, which will increase the number of user terminals 100 admitted to the Wi-Fi cell 60. Conversely, the effective coverage area may be decreased by raising the RSSI-Admit threshold, which will decrease the number of user terminals 100 admitted to the Wi-Fi cell 60.

Figure 4:
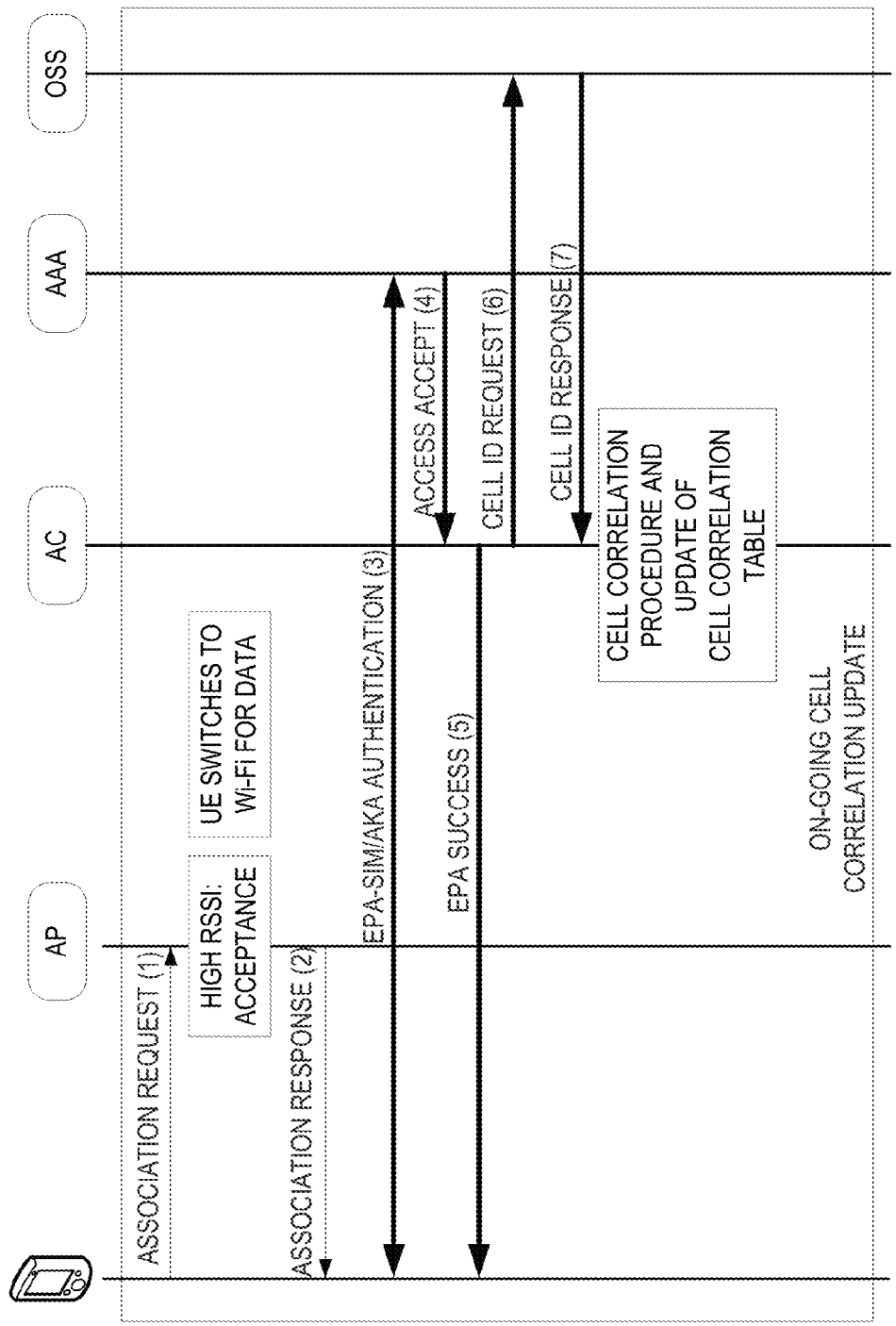
FIG. 4 illustrates an exemplary method of correlating cellular network cells with Wi-Fi cells.

FIG. 4 illustrates signaling involved in the correlation of cellular network cells 30 to Wi-Fi cells 60. A user terminal 100 sends an association request to the AP 60 in a Wi-Fi cell 60 to switch its connection from a cellular network cell 30 to the Wi-Fi cell 60 (step 1). In this example, it is assumed that the RSSI is high and that the association request is accepted. In this case, the AP 55 in the Wi-Fi cell 60 sends an association response to the user terminal 100 (step 2). The user terminal 100 then initiates an authentication procedure with an Authentication, Authorization, and Accounting (AAA) server 65 in the WLAN 50 (step 3). The authentication procedure may, for example, use the Extensible Authentication Protocol Subscriber Identity Module (EAP-SIM) method or the Authentication and Key Agreement (AKA) authentication method. If the user terminal 100 is successfully authenticated by the AAA server 65, the AAA server 65 sends an Access Accept message to the AC node 70 in the WLAN 50 (step 4). The Access Accept message includes an authentication response message, such as on EAP Success message, and the IMSI of the user terminal 100. The AC node 70 associates the IMSI of the user terminal 100 with the MAC address of the user terminal 100. The AC node 70 then sends the authentication response message (e.g., EAP Success message) to the user terminal 100 to indicate successful authentication (step 5). Also, upon receipt of the Access Accept message from the AAA server 65, the AC node 70 sends a Cell Identification (ID) Request message to the OSS 35 (step 6). The Cell ID Request message includes the IMSI of user terminal 100 provided by the AAA server 65. In response to the Cell ID Request message, the OSS 35 sends a Cell ID Response message to the AC node (step 7). The Cell ID Response message includes the cell ID of the last known cell 30 in which the user terminal 100 was present. The AC node 70 then performs a cell correlation procedure to map the cell ID to the Wi-Fi cell 60 and updates a cell correlation table stored and maintained by the AC node 70 (step 8). The cell correlation table includes a list of Wi-Fi cells 60 and corresponding cell IDs for cellular network cells 30 that have been correlated with each Wi-Fi cell 60.

Table 1 below lists functions performed by the OSS 65 and AC node 70 related to cell mapping.

TABLE 1

Cell Correlation Requirements

| Node | Requirement | Comments |
|------|-------------|----------|
| OSS | Create table with IMSI, Cell ID, Cell Type and Timestamp when mapping event are received | |
| OSS | Respond to IMSI->Cell ID mapping queries over a Google Buf based interface to AC with Latest Cell ID the user terminal was known to be in Type of the cell (GSM/WCDMA/LTE) Coordinated Universal Time (UTC) timestamp for latest time of validity UTC current time | Current time is used for AC to compensate for clock differences |
| AC | Select user terminals with IMSI availability to query for cell ID mapping with the following input: IMSI of the user terminal Basic Service Set Identification (BSSID) the user terminals is in | Must select appropriate time to query, taking into consideration event updating on OSS is delayed |
| AC | Create and maintain an | Table updating may be |

TABLE 1-continued

Cell Correlation Requirements

| Node | Requirement | Comments |
|---|---|---|
| | AP->Cell ID mapping table Allow up to 9 cells to be mapped to an AP Calculate and maintain a weight on each mapped cell based on primary cell mapping count | once a day or twice a day. Cell weight is to be used in calculating weighted average of user terminal 100 average throughput |

Figure 5:
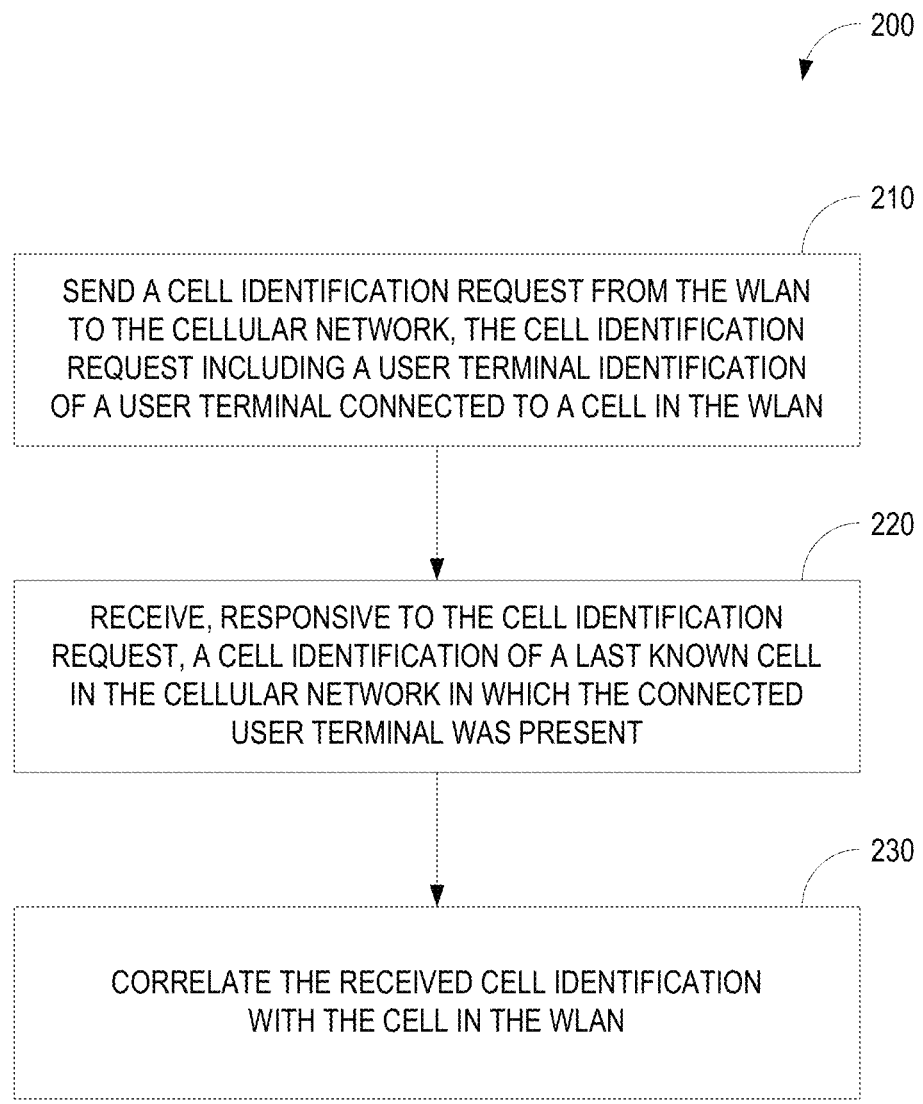
FIG. 5 illustrates a correlation method implemented by a network node in the WLAN.

FIG. 5 illustrates an exemplary cell correlation method 200 implemented by a network node in the WLAN 50 for correlating cells in first and second access networks. The network node may, for example, comprise an AC node 70 in the WLAN 50. The network node in the WLAN 50 sends a cell ID request to the cellular network 10 (block 210). The Cell ID request includes a user terminal ID (e.g., IMSI) that is used by the user terminal 100 in the cellular network 10. Responsive to the cell identification request, the network node receives a cell ID of a last known cell in the cellular network 10 in which the user terminal 100 was present (block 220). The network node in the WLAN 50 then correlates the received cell ID with a Wi-Fi cell 60 in the WLAN 50 to which the user terminal 100 is currently connected (block 230). The correlation may stored in a cell correlation table (block 240).

Figure 6:
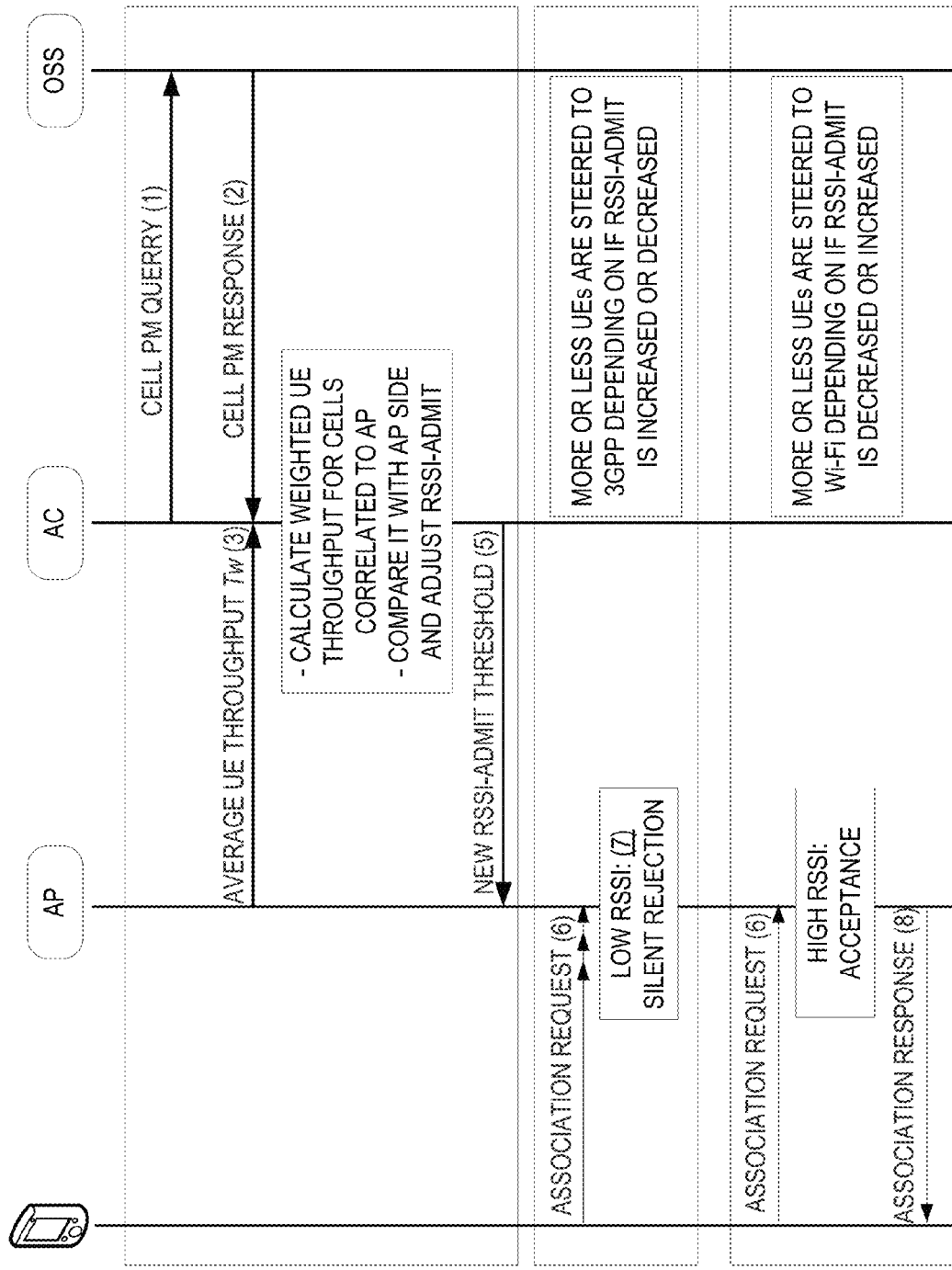
FIG. 6 illustrates an exemplary method of controlling access selection by a user terminal between cellular network cells and Wi-Fi cells.

FIG. 6 illustrates signaling involved in access selection by a user terminal between the cellular network 10 and WLAN 50. The AC node 70 sends a Cell Performance Measurement (PM) Query to the OSS 35 to request performance measurements for the cellular network cells 30 correlated with the Wi-Fi cells 60 within its domain (step 1). The Cell PM Query includes the cell IDs of the cellular network cells 30 correlated with one or more Wi-Fi cells 60 in the WLAN 50. The Cell PM Query may be sent at periodic intervals (e.g., at 1 minute intervals), or may be event triggered. In response to the Cell PM Query, the OSS 35 sends the requested performance measurements for the identified cells to the AC node 70 (step 2). In one exemplary embodiment, the performance measurements comprise the average user terminal throughput $T_a$ for each cellular network cell 30 identified by the request. Alternatively, other performance data could be provided enabling the AC node 70 to compute the average user terminal throughput $T_a$ for each cellular network cell 30. The APs 55 in the WLAN 50 also calculate and report the average user terminal throughput $T_w$ at the same time interval for the respective Wi-Fi cells 60 in the WLAN 50. For each Wi-Fi cell 60, the AC node 70 calculates a weighted average user terminal throughput $T_c$ for the cellular network cells 30 correlated with each Wi-Fi cell 60 and compares it with the average user terminal throughput $T_w$ for the Wi-Fi cell 60 (step 4). Based on the comparison, the AC node 70 adjusts the RSSI-Admit threshold for the Wi-Fi cell 60 and sends the adjusted RSSI-Admit threshold to the AP 55 for the Wi-Fi cell 60 (step 5). The RSSI-Admit threshold is thereafter used by the AP 55 to control admission of user terminals 100 to the Wi-Fi cell 60. Equivalently, the AC node 70 could send the adjustment to the RSSI-Admit threshold to the AP 55 and the AP 55 could add the adjustment to the current RSSI-Admit threshold to obtain the new RSSI-Admit threshold. When the AP 55 receives a request message such as an Authentication Request, Probe Request, or association request from a user terminal 100 (step 6), the AP 55 measures the RSSI for the user terminal 100 and compares the measured RSSI to the RSSI-Admit threshold. If the measured RSSI is less than the threshold, the AP 55 silently rejects the user terminal 100 by dropping the received request messages (step 7). If the RSSI is above the threshold, the AP 55 sends a corresponding response message to the user terminal 100 (step 8).

Table 2 below provides further details regarding the functions performed by the OSS 35 and AC node 70 related to access selection.

TABLE 2

Access Selection Requirements

| Node | Requirement |
|---|---|
| OSS | Provide external SQL interface for AC to query performance measurements so as to derive average user terminal throughput |
| AC | Query performance measurements through SQL for deriving average user terminal throughput |
| AC | Calculate on-going daily trend of average user terminal throughput for each cell using actual data only |
| AC | Make a statistic prediction of current value of average user terminal throughput from a daily trend and the latest actual values |
| AC | Calculate a predicted current value of weighted user terminal throughput |
| AC | Adaptive RSSI-admit level control loop |
| AC | Communicate with AP to collect user terminal average throughput info and push new RSSI-Admit value to AP |
| AP | Calculate average user terminal throughput and communicate with AC for reporting. |
| AP | Execute commands from AC to activate new RSSI-Admit levels |

Figure 7:
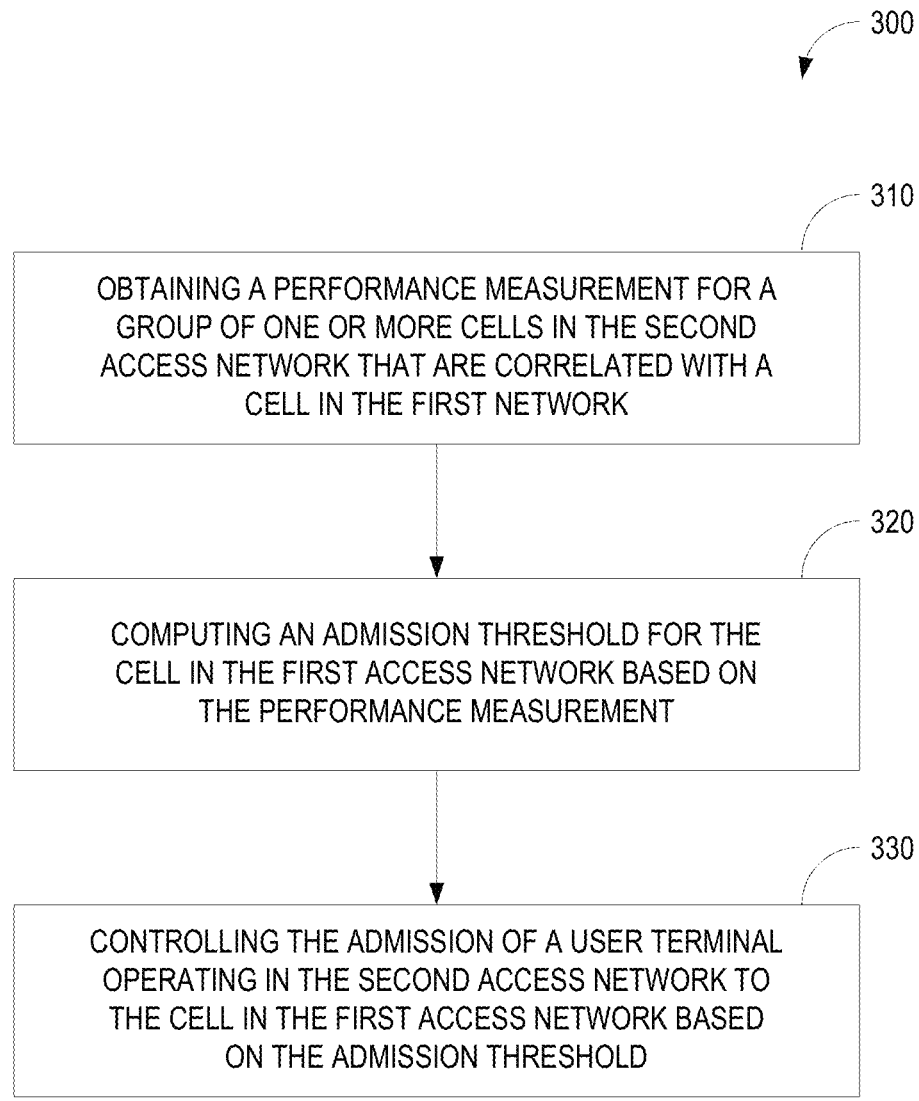
FIG. 7 illustrates a method implemented in a WLAN of controlling access selection by a user terminal.

FIG. 7 illustrates an exemplary method 300 controlling access selection by a user terminal between the WLAN 50 and a cellular network 10 that provides overlapping coverage with the WLAN 50. The method 300 may be performed by AC node 70 in the WLAN 50 or by an AP 55. A performance measurement is obtained for a group of cellular network cells 30 in the cellular network 10 that are correlated with a Wi-Fi cell 60 in the WLAN 50 (block 310). The performance measurement may, for example, comprise the aggregate average user terminal throughput, $T_c$, for the cellular network cells 30 that are correlated with the Wi-Fi cell 60. An admission threshold (e.g., RSSI-Admit threshold) for the Wi-Fi cell 60 is computed based on the performance measurement for the group of cellular network cells 30 in the cellular network 10 that are correlated with the Wi-Fi cell (block 320). Admission of user terminal 100 attempting to connect to the Wi-Fi cell 60 to the WLAN 50 is controlled based on the admission threshold for the Wi-Fi cell 60 (block 330).

In some embodiments, the AC node 70 correlates the group of one or more cells 30 in the cellular network 10 with a Wi-Fi cell 60 in the WLAN 50. The AC node 70 may obtain the performance measurement for the cells 30 in the cellular network 10 by requesting individual performance statistics (e.g., per cell average user terminal throughput, $T_a$) for the correlated cells 30 in the cellular network 10 and computing the performance measurement (e.g., aggregate average user terminal throughput, $T_c$) for the correlated cellular network cells 30 based on the individual performance statistics. The AC node 70 may further use the performance measurement to compute the admission threshold. To compute the admission threshold, the AC node 70 may also receive a performance measurement (e.g., average user terminal throughput, $T_w$) for the Wi-Fi cell 60 from the AP 55. The AC node 70 may further control the admission of user terminals 100 to the Wi-Fi cell 60 by sending the computed admission threshold to the AP 55. The AP 55 may then use the admission threshold to determine whether to admit user terminals 100 to the Wi-Fi cell 60. Alternatively, admission control decisions may be made by the AC node 70. In this case, the AP 55 may send RSSI measurements associated with a user terminal 100 to the AC node 70. The AC node 70 may decide whether to admit the user terminal 100 by comparing the RSSI measurements to the admission threshold.

In other embodiments, the AP 55 may receive the performance measurement (e.g., aggregate average user terminal throughput, $T_c$) of the correlated cellular network cells 30 from the AC node 70 and use the performance measurement to compute the admission threshold as previously described. Alternatively, the AP 55 may receive individual performance statistics (e.g., per cell average user terminal throughput, $T_a$) for correlated cells 30 in the cellular network 10 from either the AC node 70, or from the OSS 35 in the cellular network 10. The AP 55 in this embodiment may compute the performance measurement (e.g. aggregate average user terminal throughput, $T_c$) for the correlated cellular network cells 30 based on the performance statistics. In embodiments where the admission threshold is computed by the AP 55, the AP 55 may further control admission to the Wi-Fi cell 60 by comparing RSSI measurements for a user terminal 100 attempting to connect to the Wi-Fi cell 60 with the admission threshold.

Figure 8:
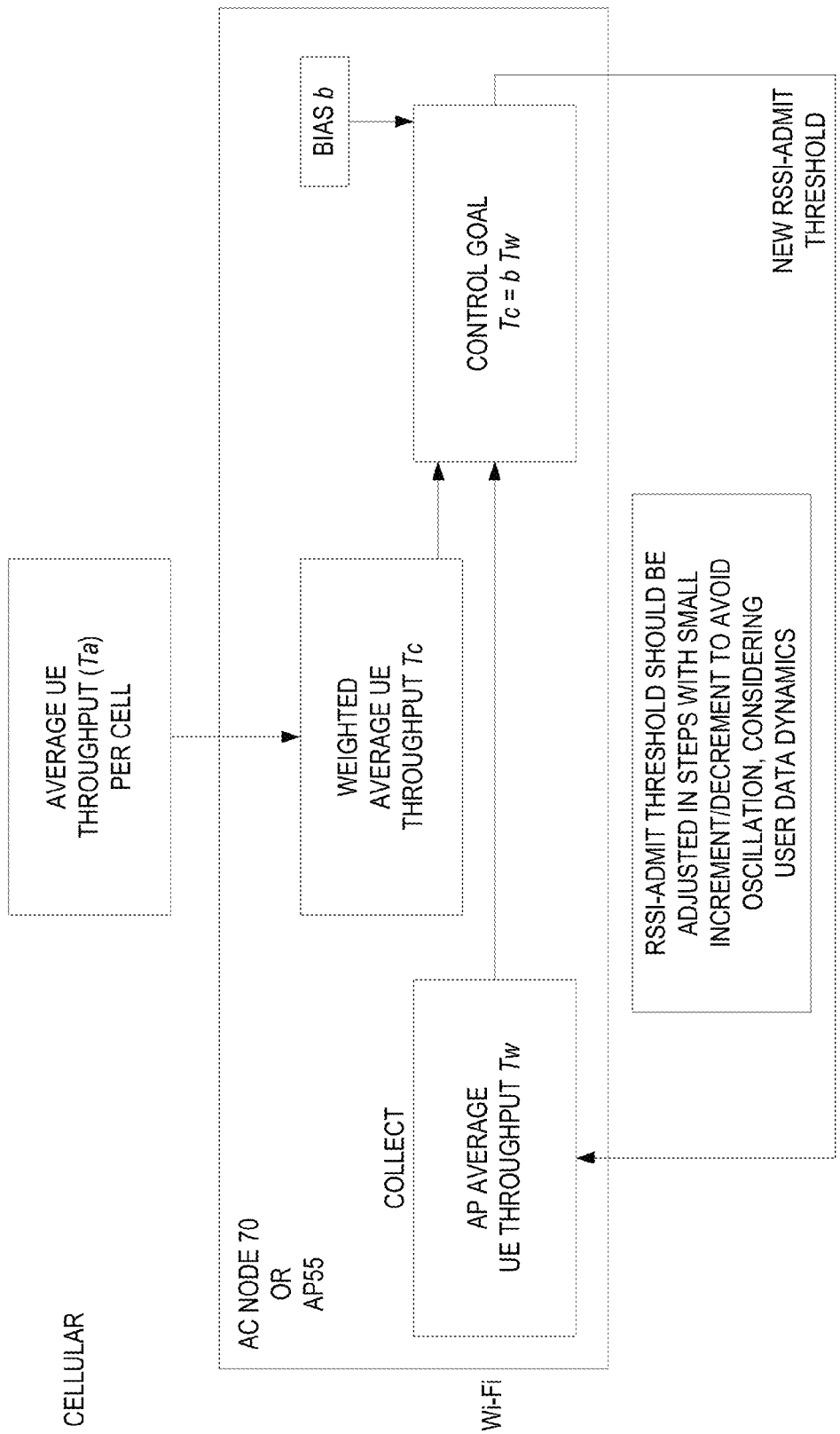
FIG. 8 illustrates exemplary processing performed by an access control node in a WLAN.

FIG. 8 illustrates an adaptive control loop for adjusting the admission threshold used for controlling access selection by a user terminal between the cellular network 10 and WLAN 50. The average user terminal throughput $T_a$ for cellular network cells 30 correlated with a Wi-Fi cell 60 are input to a processing circuit within the AC node 70. The processing circuit computes the weighted average user terminal throughput, $T_c$ for the cells 30 of the cellular network 10 correlated with a Wi-Fi cell 60. The processing circuit receives the average user terminal throughput, $T_w$, for the Wi-Fi cell 60 from the AP 55. The processing circuit compares the weighted average throughput $T_c$ for the cellular network cells 30 with the average throughput $T_w$ of the Wi-Fi cell 60. The average user terminal throughput $T_w$ for the Wi-Fi cell 60 may be multiplied by a bias factor b. Based on the comparison, the processing circuit either increments or decrements the RSSI-Admit threshold. In one exemplary embodiment, the RSSI-Admit threshold is incremented or decremented in small steps to avoid oscillation. When the bias factor b is equal to 1, the RSSI-Admit threshold is incremented when $T_w$ is less than $T_c$ and decremented when $T_w$ is greater than $T_c$. A bias factor b greater than 1 favors the Wi-Fi cell 60, while a bias factor b less than 1 favors the cellular network 10. In one exemplary embodiment, a RSSI-Admit threshold is changed only when the difference between $bT_w$ and $T_c$ meets a threshold (e.g. 20% difference). The adjusted RSSI-admit threshold is provided to the AP 55.

For WCDMA networks, the weighted average user throughput $T_c$ may be computed from the average user throughputs $T_a(s)$ for the individual cellular network cells 30 according to:

$$T_c = \sum_{i=1}^{n} w_i T_a(i), \qquad \text{Eq. (1)}$$

where n is the number of cellular network cells 30 correlated to the Wi-Fi cell 60, $w_i$ is a normalized weighting factor for the ith cellular network cell 30, and $T_a(i)$ is the average user terminal throughput of the ith cellular network cell 30. The weighting factor $w_i$ for cell i may be computed according to:

$$w_i = \frac{h_i}{\sum_i^n h} \qquad \text{Eq. (2)}$$

where $h_i$ is the hit count for cell i and the summation in the denominator is the sum of the hit counts for cells 1 through n. The hit count $h_i$ for a cellular network cell 30 reflects the degree of overlap between the cellular network cell 30 and the Wi-Fi cell 60 and is computed based on number of times that a user terminal 100 moves from a given cellular network cell 30 to the Wi-Fi cell 60 in a given time interval (e.g., the past one hour or one day). The hit count $h_i$ is maintained by the AC node 70 for each cellular network cell 30 that is correlated with a Wi-Fi cell 60. In one exemplary embodiment, the hit count $h_i$ for a cellular network cell 30 is incremented each time the cell ID of the cellular network cell 30 is returned by the OSS 35 in response to a Cell ID Request.

Because the hit counts $h_i$ for cellular network cells 30 in the different types of networks may not be directly comparable, the hit counts $h_i$ for the cellular network cells 30 may be multiplied by different bias factors depending on the type of the cellular network cells 30. The bias factor may comprise an integer between 1 and 10. A default bias factor of 1 may be used when not otherwise specified. The bias factors are applied to the hit counts before determining the weighting factors for the cellular network cells 30.

Figure 9:
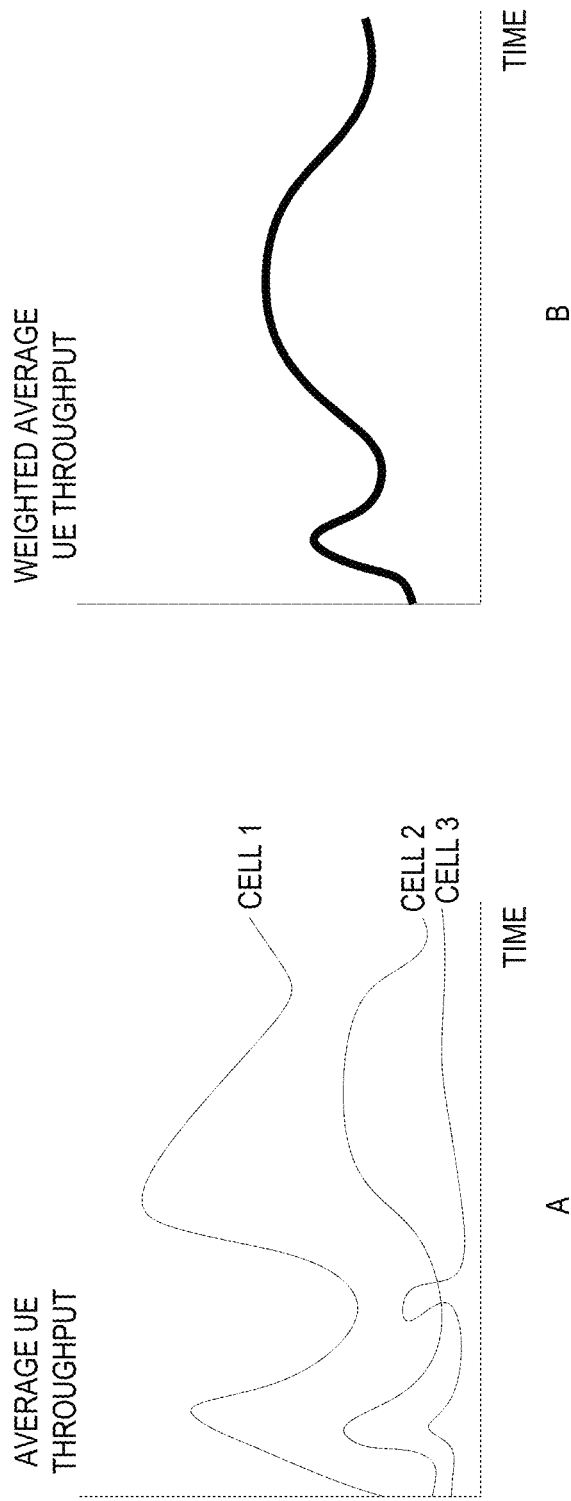
FIGS. 9A and 9B graphically illustrate a method of computing a weighted average user terminal throughput used for controlling access selection by a user terminal.

FIGS. 9A and 9B graphically illustrates the weighted average for the cellular network cells 30 correlated with a Wi-Fi cell 60. FIG. 9A shows the average user terminal throughput for three cellular network cells 30 identified as Cell 1, Cell 2 and Cell 3. FIG. 9B shows a weighted average user terminal throughput for the same three cellular network cells 30.

To be comparable to the average user throughput for the cellular network cells 30, the average user terminal throughput for the Wi-Fi cell 60 is based on downlink (DL) data throughput. The downlink data throughput $T_d$ and the number of active users is measured and reported every one second. The average user terminal throughput $T_w$ is then calculated every one minute.

Those skilled in the art will appreciate that although the average user terminal throughput $T_a$ for a cellular network cell 30 and the average user throughput $T_w$ for a Wi-Fi cell 60 may be computed every minute, a longer time window may be used to compute the average. For example, the average user terminal throughputs $T_a$ and $T_w$ may be computed every one minute based on the traffic occurring over the last 15 minutes.

In actual practice, the latest measurements of the average user terminal throughputs $T_a(s)$ for the cellular network cells 30 available to the AC node 70 for computing the weighted average user terminal throughput $T_c$ may not always be current. The availability of the data may be delayed by as much as 45 minutes for a number of reasons.

According to one aspect of the present disclosure, a method is provided for predicting the current average user terminal throughput for individual cellular network cells 30 of the cellular network 10 in situations where the available data is not current. The predicted average user terminal throughput for a cell, denoted $\check{T}_a$, may then be used to compute the weighted average throughput $T_c$ by substituting the predicted average user terminal throughput $\check{T}_a$ for the average user terminal throughput $T_a$ in Eq. (1) to obtain:

$$T_c = \sum_{i=1}^{n} w_i \tilde{T}_a(i),$$  Eq. (3)

Figure 10:
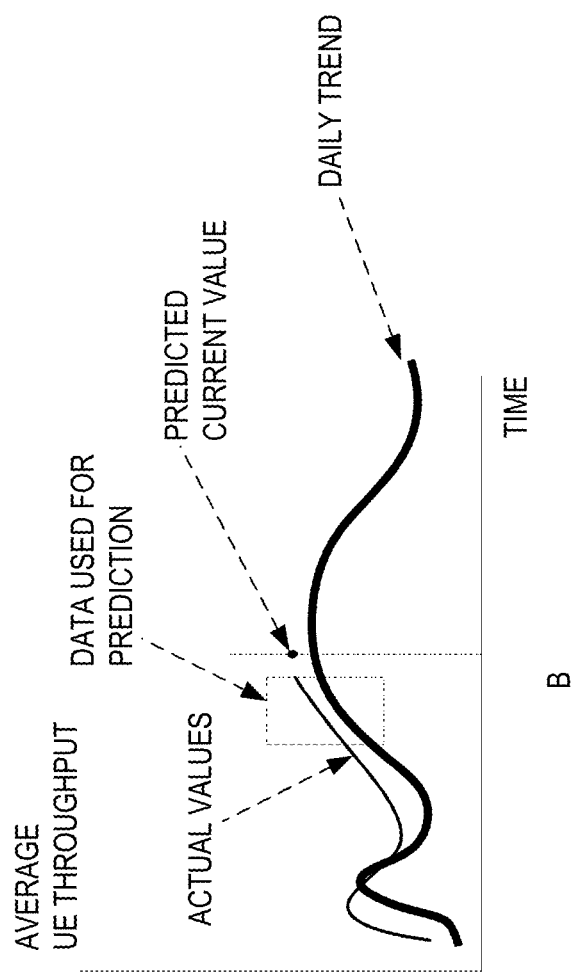
FIG. 10 illustrates a method of predicting a current user terminal throughput from historical data.

FIG. 10 graphically illustrates the prediction of the current average user terminal throughput $\check{T}_a$ for a cellular network cell 30 in one exemplary embodiment. In this embodiment, an on-going daily trend $T_{tr}$ is calculated for the average user terminal throughput. The latest average user terminal throughput $T_a$, together with the daily trend $T_{tr}$, is then used to predict the current user terminal throughput $\check{T}_a$.

In one exemplary embodiment, the daily trend is computed from the average user terminal throughput values collected over a period of days, weeks or months. The daily trend comprises a set of data points at different times t during a one day period. In one exemplary embodiment, the daily trend is computed every one minute by averaging $T_a$ at the same time t over a predetermined number of days. In one exemplary embodiment, the daily trend is computed over a 7 day time window. In some embodiments, a daily trend $T_{tr}$ may be calculated separately for weekdays, Saturday, and Sunday. Also, a separate daily trend $T_{tr}$ may be computed for each day of the week if the traffic varies significantly from day to day. A daily trend based on weekdays only is referred to herein as a weekday trend. A daily trend based on the same day of week over a plurality of weeks is referred to herein as a calendar day trend. For example, a daily trend based on data collected each Saturday over a plurality of Saturday is a calendar day trend. The daily trend $T_{tr}$ at time t is given by:

$$T_{tr}(t) = \frac{\sum_{1}^{n} T_a(t)}{n}$$  Eq. (4)

where n is the number of days over which the daily trend is computed.

The most recent data for the average user throughput $T_a$ and the daily trend is used to predict a current value of the average user terminal throughput $\check{T}_a$. The most recent measurements of the average user terminal throughput $T_a$ are averaged over a predetermined time period (e.g. one hour) to obtain a composite average throughput $T_{avg}$ for the most recent time window. The daily trend is then averaged over the same time window to obtain an average of the daily trend $T_{tr\_avg}$. The difference between the current value of the daily trend $T_{tr\_current}$ at time t and the average of the daily trend $T_{tr\_avg}$ is computed to obtain $\Delta T_{tr}$. The predicted average user terminal throughout $\check{T}_a$ is given by:

$$\check{T}_a(t) = T_{avg} + \Delta T_{tr}$$  Eq. (5)

Other ways of computing the predicated average user terminal throughput could also be used.

Although the prediction techniques described above were used to predict current average user terminal throughput, those skilled in the art will appreciate that the same techniques can be applied in other contexts and that the prediction techniques can be applied to other situation where the most recent available data is not current.

Figure 11:
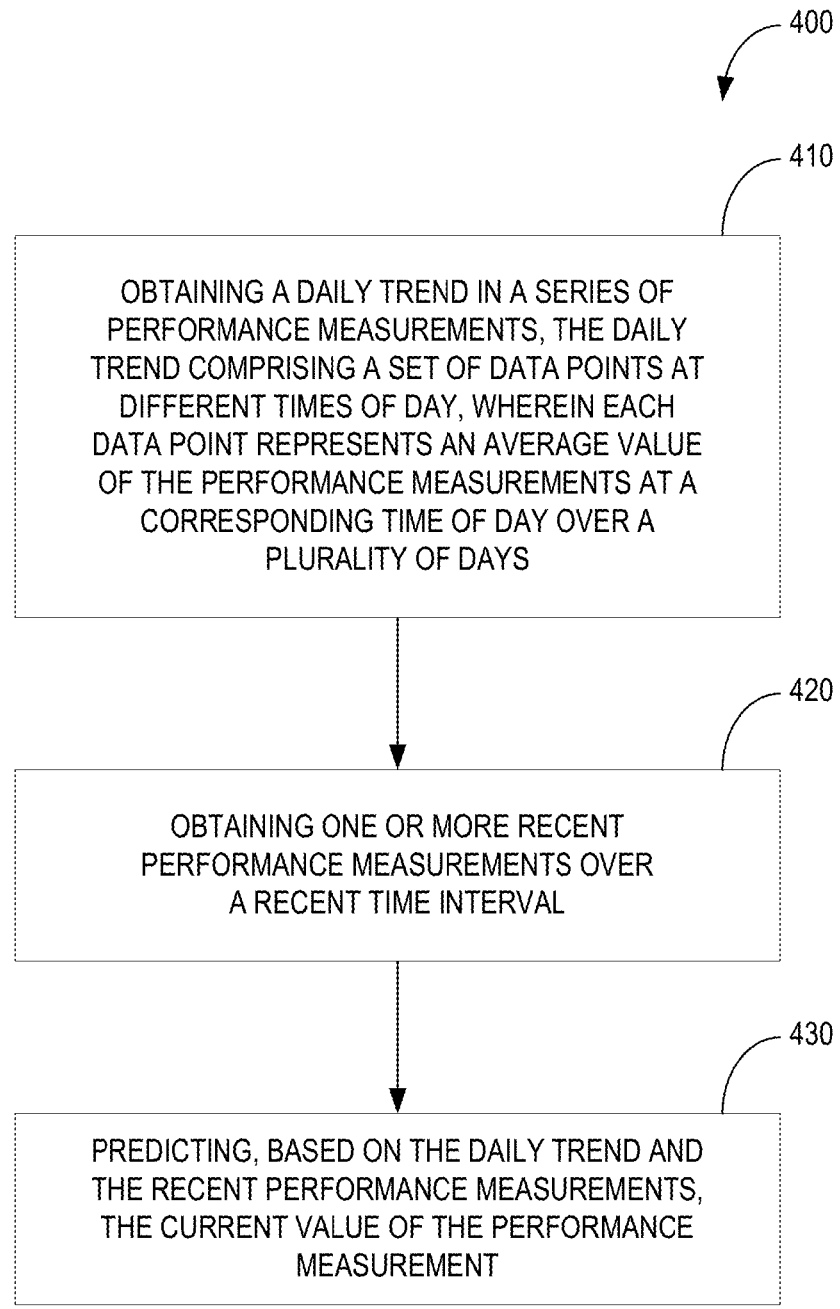
FIG. 11 illustrates an exemplary method of predicting a current value of a performance measurement.

FIG. 11 illustrates an exemplary method 400 implemented by an AC node 70 or other network node for predicting a current value of a performance measurement indicative of network performance. The AC node 70 or other network node obtains a daily trend in a series of performance measurements (block 410). The daily trend comprises a set of data points at different times of day, wherein each data point represents an average value of the performance measurements at a corresponding time of day over a plurality of days. The AC node 70 or other network node also obtains one or more recent performance measurements over a recent time interval (block 420). Based on the daily trend and the recent performance measurements, the AC node 70 or other network node predicts the current value of the performance measurement (block 430).

Figure 12:
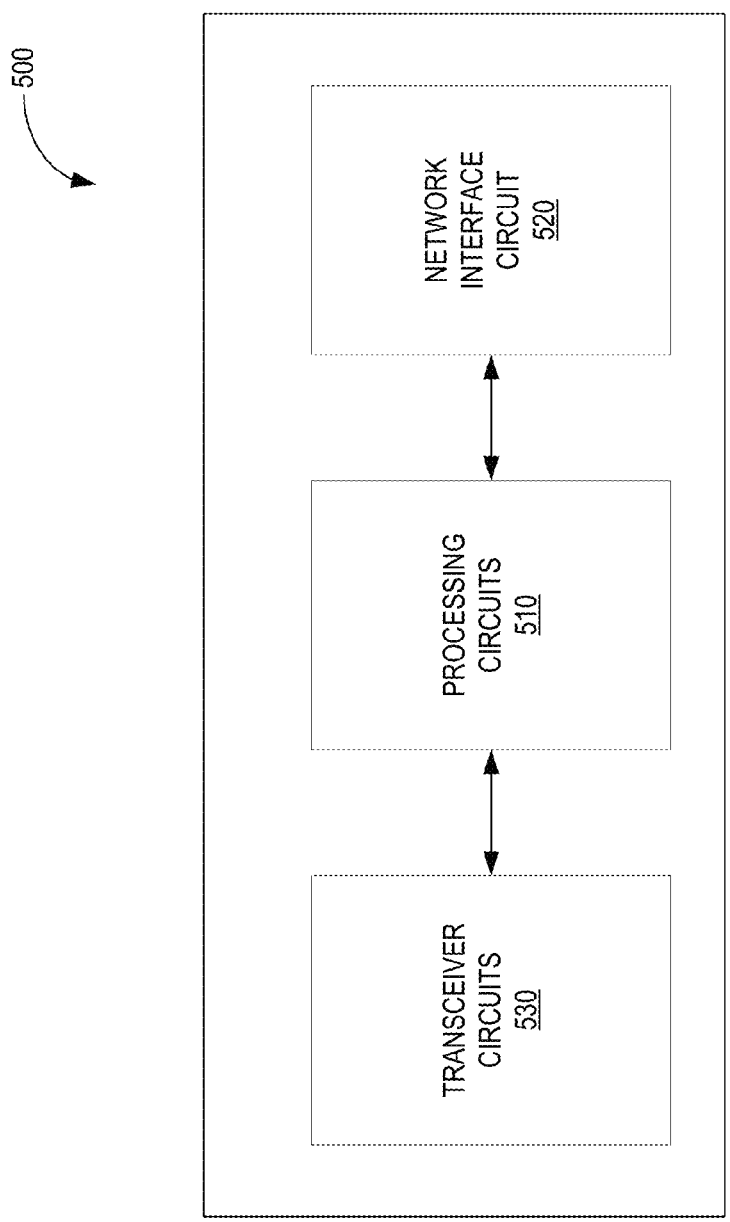
FIG. 12 illustrate an exemplary network node.

FIG. 12 illustrates an exemplary network node 500 for implementing access selection control as herein described. The network node 500 comprises a network interface circuit 510 for connecting to a communication network and communicating over the network with other network nodes, and a processing circuit 520 configured to perform one or more of the methods described herein. In one embodiment, the network node 500 functions as an AC node 70 as herein described. In other embodiments, the network node 500 functions an AP 55 in the WLAN 50 as herein described and further includes a transceiver 530 for communicating with user terminals 100 over a radio interface. In other embodiments, the network node 200 comprises an OSS 35 in the cellular network 10 and the processing circuit 220 is configured to provide an AC node 70 or AP 55 in the WLAN 50 with cell IDs and performance statistics as herein described.

What is claimed is:

1. A method implemented by a network node in a communication network of controlling admission of user terminals in the communication network, the method comprising:
   obtaining a daily trend in a series of performance measurements, the daily trend comprising a set of data points at different times of day, wherein each data point represents an average value of the performance measurements at a corresponding time of day over a plurality of days;
   obtaining one or more recent performance measurements over a recent time interval;
   predicting, based on the daily trend and the recent performance measurements, the current value of the performance measurement; and
   controlling admission to the communication network based on the predicted current value of the performance measurement,
   wherein controlling admission to the communication network comprises determining an admission threshold based on the predicted current value of the performance measurement, and admitting user terminals to the communication network based on the admission threshold.

2. The method of claim 1 wherein predicting the current value of the performance measurement comprises:
   computing a first average value of the recent performance measurements over the recent time interval;
   computing a second average value of the daily trend over the recent time interval; and
   predicting the current value of the performance measurement as a function of the first and second average values.

3. The method of claim 2 wherein predicting the current value of the performance measurement as a function of the first and second average values comprises:
   computing a difference between the second average value of the daily trend and a current value of the daily trend; and
   adding the difference to the first average value to obtain the current value of the performance measurement.

4. The method of claim 1 wherein obtaining a daily trend in a series of performance measurements comprises maintaining a record of historic performance measurements, and computing the daily trend from the record of historic performance measurements.

5. The method of claim 1 wherein the daily trend comprises a weekday trend based on performance measurements over a plurality of weekdays.

6. The method of claim 1 wherein the daily trend comprises a calendar day trend based on performance measurements taken on the same calendar day over a plurality of weeks.

7. The method of claim 1 wherein the performance measurement comprises an average throughput.

8. The method of claim 1 wherein the method comprises predicting the current value of the performance measurement in response to determining that the one or more recent performance measurements are not current.

9. The method of claim 1 wherein the controlling admission to the communication network comprises controlling admission based on the predicted current value of the performance measurement and a network bias that is dynamically adjusted based on network conditions.

10. A network node in a wireless communication network for controlling admission of user terminals in the communication network, the network node comprising:
    a network interface circuit for communicating with other network nodes; and
    a processing circuit configured to predict a current value of a performance measurement, the processing circuit being configured to:
        obtain a daily trend in a series of performance measurements, the daily trend comprising a set of data points at different times of day, wherein each data point represents an average value of the performance measurements at a corresponding time of day over a plurality of days;
        obtain one or more recent performance measurements over a recent time interval;
        predict, based on the daily trend and the recent performance measurements, the current value of the performance measurement; and
        control admission to the communication network based on the predicted current value of the performance measurement by:
            determining an admission threshold based on the predicted current value of the performance measurement, and
            admitting user terminals to the communication network based on the admission threshold.

11. The network node of claim 10 wherein the processing circuit is configured to predict the current value of the performance measurement by:
    computing a first average value of the recent performance measurements over the recent time interval;
    computing a second average value of the daily trend over the recent time interval; and
    predicting the current value of the performance measurement as a function of the first and second average values.

12. The network node of claim 11 wherein the processing circuit is configured to predict the current value of the performance measurement as a function of the first and second average values by:
    computing a difference between the second average value and a current value of the daily trend; and
    adding the difference to the first average value to obtain the current value of the performance measurement.

13. The network node of claim 10 wherein the processing circuit is configured to obtain a daily trend in a series of performance measurements by maintaining a record of historic performance measurements, and computing the daily trend from the record of historic performance measurements.

14. The network node of claim 10 wherein the daily trend obtained by the processing circuit comprises a weekday trend based on performance measurements over a plurality of weekdays.

15. The network node of claim 10 wherein the daily trend obtained by the processing circuit comprises a calendar day trend based on performance measurements taken on the same calendar day over a plurality of weeks.

16. The network node of claim 10 wherein the performance measurement predicted by the processing circuit comprises an average throughput.

17. The network node of claim 10 wherein the processing circuit is configured to control admission to the communication network based on the predicted current value of the performance measurement and a network bias that is dynamically adjusted based on network conditions.

* * * * *